(12) United States Patent
Eshraghian et al.

(10) Patent No.: US 8,982,260 B2
(45) Date of Patent: Mar. 17, 2015

(54) IMAGE MATCHING, DATA COMPRESSION AND TRACKING ARCHITECTURES

(75) Inventors: Kamran Eshraghian, Rostrevor (AU); Kyoungrok Cho, Taejon (KR); Peter Graham Foster, Parkside (AU)

(73) Assignee: Idatamap Pty. Ltd. (AU)

( * ) Notice: Subject to any disclaimer, the term of this patent is extended or adjusted under 35 U.S.C. 154(b) by 122 days.

(21) Appl. No.: 13/578,417

(22) PCT Filed: Feb. 11, 2011

(86) PCT No.: PCT/AU2011/000152
§ 371 (c)(1),
(2), (4) Date: Dec. 4, 2012

(87) PCT Pub. No.: WO2011/097687
PCT Pub. Date: Aug. 18, 2011

(65) Prior Publication Data
US 2013/0076950 A1    Mar. 28, 2013

(30) Foreign Application Priority Data
Feb. 11, 2010    (AU) .............................. 2010900531

(51) Int. Cl.
| H04N 3/14 | (2006.01) |
| H04N 5/76 | (2006.01) |
| H04N 5/3745 | (2011.01) |
| G11C 13/00 | (2006.01) |
| G11C 15/04 | (2006.01) |
| G11C 27/02 | (2006.01) |
| G11C 13/04 | (2006.01) |

(52) U.S. Cl.
CPC .......... H04N 5/3745 (2013.01); G11C 13/0007 (2013.01); G11C 15/046 (2013.01); G11C 27/02 (2013.01); G11C 13/04 (2013.01)
USPC ..................................... 348/308; 348/231.99

(58) Field of Classification Search
CPC ..... H04N 5/3355; H04N 5/772; H04N 3/155; G11C 15/00
USPC .......... 348/302, 308, 231.2, 231.99; 711/108; 365/49.1
See application file for complete search history.

(56) References Cited

U.S. PATENT DOCUMENTS

| 6,707,410 | B1 * | 3/2004 | Bock .............................. 341/155 |
| 6,922,210 | B2 * | 7/2005 | Yang et al. ..................... 348/308 |
| 7,848,128 | B2 * | 12/2010 | Arsovski et al. ........... 365/49.17 |
| 7,940,278 | B2 * | 5/2011 | Pham et al. ..................... 382/165 |
| 8,530,880 | B2 * | 9/2013 | Strukov et al. ..................... 257/5 |
| 2008/0235443 | A1 | 9/2008 | Chow et al. |
| 2011/0317469 | A1 * | 12/2011 | Borghetti et al. ............. 438/129 |

FOREIGN PATENT DOCUMENTS

WO    2011014156    2/2011

* cited by examiner

Primary Examiner — Nhan T Tran
(74) Attorney, Agent, or Firm — Volpe and Koenig, P.C.

(57) ABSTRACT

Integrated photo detector receptor with Memristor Memory cell to perform simultaneous image capture and image matching as part of meta-security camera.

3 Claims, 13 Drawing Sheets

IMAGE MATCHING, DATA COMPRESSION AND TRACKING ARCHITECTURES

FIELD OF INVENTION

Security is a major concern of every community and the concept of meta-security cameras where embedded intelligence forms part of the imaging and image manipulation at high speed and very low power is becoming increasingly important. Medical image security for example is a very important privacy issue as digital images of patients are transmitted across a public networks. Security cameras are also ever-present in the modern world, but they often capture static scenes of little interest, consuming an enormous amount of communication bandwidth in the process. This invention provides a novel approach towards rapid image capture and image matching based on a combination of image sensor and Memristor-based storage/compare cell implemented as part of meta-security cameras and similar systems that can perform a multiplicity of tasks such as image matching, image tracking and motion detection at low power.

BACKGROUND

The mainstream research into Cameras-on-CMOS (CoC) technology has been focused on front-illuminated architectures, in which the Pixel Sensor and the signal processing circuitry are integrated in the same plane. This architecture is disadvantaged in a number ways, including the incompatibility of different CCD and CMOS processing technologies that are currently used and low Fill Factors.

Camera-on-a-CMOS chip will be an inevitable component of future intelligent vision systems. However, up till now, the dominant format of data in imaging devices is still analog. The analog photocurrent or sampled voltage is transferred to the ADC via a column or a column/row bus. Moreover, in the active pixel configuration the area occupied by circuitry reduces significantly the fill factor, so that there are heavy constraints imposed on the size of the circuits used.

This invention provides a novel approach towards rapid image capture and image matching based on a combination of image sensor and Memristor-based storage/compare cell implemented as part of meta-security cameras and similar systems that can perform multiplicity of tasks such as image matching, image tracking and motion detection at low power. Additionally, an approach for image tracking and motion detection is disclosed.

In our structure, both image capture and image matching is carried out at the same time. Significant advantage of this invention is its high-speed capability as well as providing a very secure imaging environment when power source is disrupted or completely removed. The imager is able to retain its previous state when power source is reinstated allowing complete recovery of image data.

The existence of Memristor (M) was conceptually predicted by Chua in 1971 and generalized by Kang in 1976. Chua postulated that a new circuit element defined by the single-valued relationship $d\phi=Mdq$ must exist whereby current moving through the memristor M is proportional to the flux $\phi$ of the magnetic field that flows through the material. In another words, the magnetic flux $\phi$ between the terminals is a function of the amount of charge, q that has passed through the device. This follows from Lenz's law whereby the single-valued relationship $d\phi=Mdq$ has the equivalence $v=M(q)i$, where v and i are memristor voltage and current, respectively. In one form the memristor behaves as a switch, much similar to a transistor. However, unlike the transistor, it is a 2-terminal rather than a 3-terminal device and does not require power to retain either of its two states. A memristor changes its resistance state between two upper and lower bound values and can have multiplicity of values between these two limits. This is achieved via the movement of mobile ionic charge within an oxide layer.

Furthermore, these resistive states are non-volatile. This behavior is an important property in forensic investigation as an example that influences the architecture of image sensor systems and meta-security cameras, where the power supply of imager and stored image template blocks can be disabled without loss of stored image data.

SUMMARY

It is a general object of the present invention to provide a single switching transition per sample, Digital Pixel Sensor (DPS) as light intensity-to-state convertor with an embedded non-volatile storage in the form of Memristor forming the image data storage. In a preferred embodiment the image data is stored in a Memristor memory and is connected to a comparison means which contains an image template, also stored in a Memristor memory. In a preferred embodiment the image template stored in a Memristor Content Addressable Memory (MCAM). This allows discrimination of an exact match of digital data from an image field to the data stored in the template. In yet another preferred embodiment the comparison means provides matching through a Memristor Ternary Content Addressable Memory (MTCAM) allowing for a nearest match between image data and stored template.

In a preferred embodiment, a single inverter is used at each pixel circuit to provide voltage to time conversion. The incident light on a given pixel determines the period of time elapsed between the beginning of its acquisition (gated active) and the transition of the inverter. In other words, the time required to discharge the input of the inverter to its switching point. The switching time of the inverter is directly proportional to the light intensity incident upon the pixel. For low light intensity it switches after a (relatively) long period of time and for a high intensity light its input is discharged by a high current, so the switching occurs very soon after detecting the light.

BRIEF DESCRIPTION OF THE DRAWINGS

The present invention will be discussed hereinafter in detail in terms of the preferred embodiment of a MetaSecurity Camera System for Image Matching and Identification according to the present invention with reference to the accompanying drawings. In the following description, numerous specific details are set forth in order to provide a thorough understanding of the present invention. It will be obvious, however, to those skilled in the art that the present invention may be practiced without these specific details.

DETAILED DESCRIPTION OF THE PREFERRED EMBODIMENTS

Figure 1:
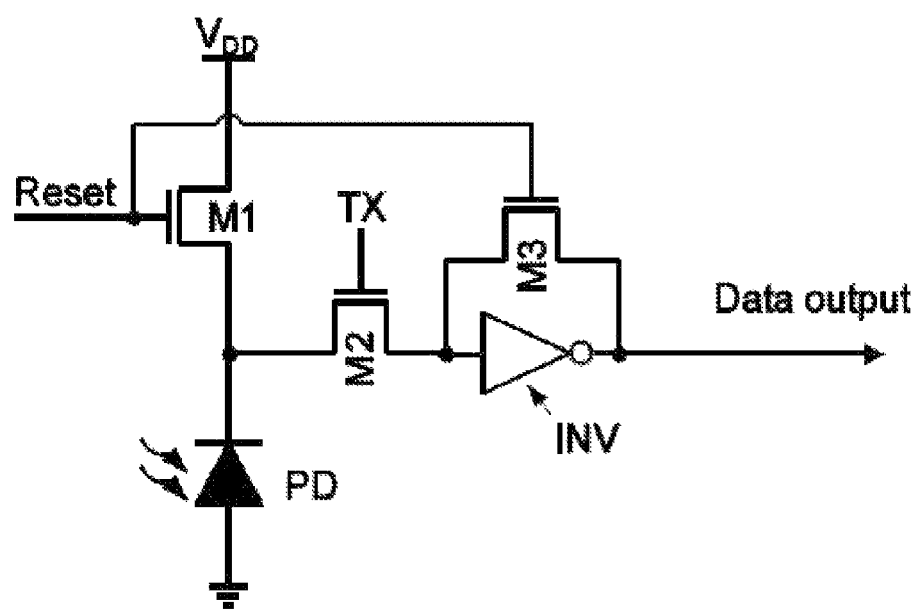
FIG. 1: A schematic representation of the Digital Pixel Sensor of the present invention.

In a preferred embodiment of the present invention, a DPS Image Sensor is shown schematically in FIG. 1 whereby the pixel output is a pulse width-modulated signal that transfers illumination levels directly to resistance state when connected to Memristor at the next layer. In a simple preferred form, each optical receptor is a CMOS diode (p-n junction) labelled "PD" with very small geometries. In this case it is an n+/p sub structure providing sufficient quantum efficiency in view of the very small size of photodiode. The optical sensor charges (or discharges) the output node at a rate proportional to the intensity of light incident upon it. A Time-to-Voltage (TTV) converter produces a digitised signal representing the incident light intensity which is converted to a voltage before being written to memory. In this embodiment the Memristor stores the image data as a resistance state.

In a preferred embodiment the TTV converter acts as a unary converter in which there is only one transition in each data word and hence providing significant reduction in dynamic power dissipation of the circuit because of reduced switching events. Transistor "M3" as shown in FIG. 1 is used to cancel the offset voltage while the "M2" transistor is OFF. Transistors "M3" and "M1" (reset) are ON simultaneously. "M2" is turned ON to decrease the input voltage of the inverter. Since inverter's output is not completely charged (almost +$V_{DD}$/2) then based on the light intensity the inverter's input decreases gradually. It is possible to increase the frame rate by decreasing the integration time.

It is a further object of the present invention to provide a method, apparatus and system for image comparison and matching. In a preferred embodiment the CMOS Image Sensor (CIS) pixel captures light intensity and stores this data in a format that is able to be compared with another data stream simultaneously using a Content Addressable Memory (CAM) as an example. This allows an exact digital match, or nearest match in the case of a ternary content addressable memory (TCAM).

It is preferred to use CMOS RAM for compatibility with the semiconductor process that manufactures the CIS pixel. However a CMOS based RAM is generally based on Static Random Access Memory (SRAM) memory structures which consume considerable area and power. To solve the problem the SRAM blocks are replaced with Memristor Random Access Memories (MRAM). The MRAM has the additional benefit of being able to store analog values for better memory density and simplifying the match process.

Figure 2:
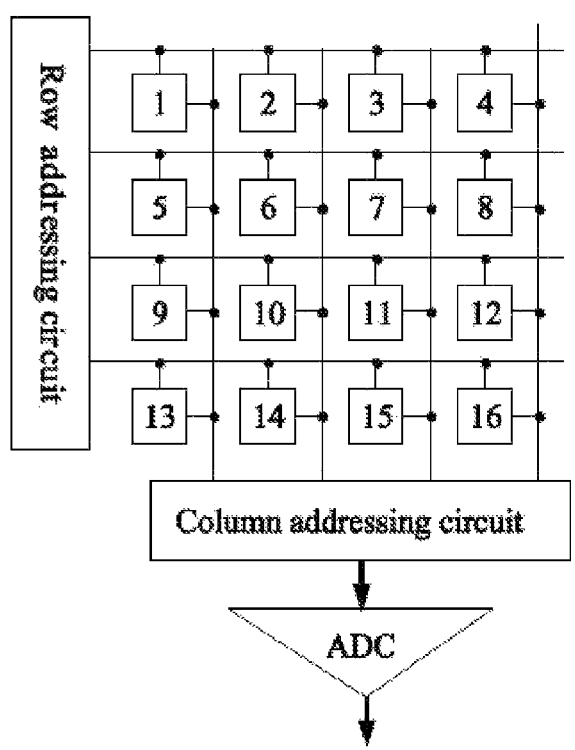
FIG. 2: A schematic representation of a prior art pixel-by-pixel digitising architecture.
Figure 3:
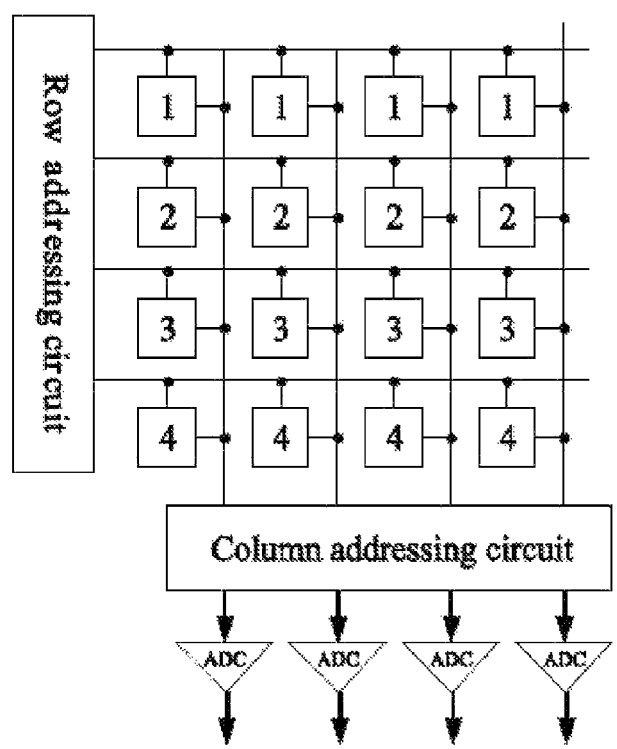
FIG. 3: A schematic representation of a prior art per-column digitising architecture.
Figure 4:
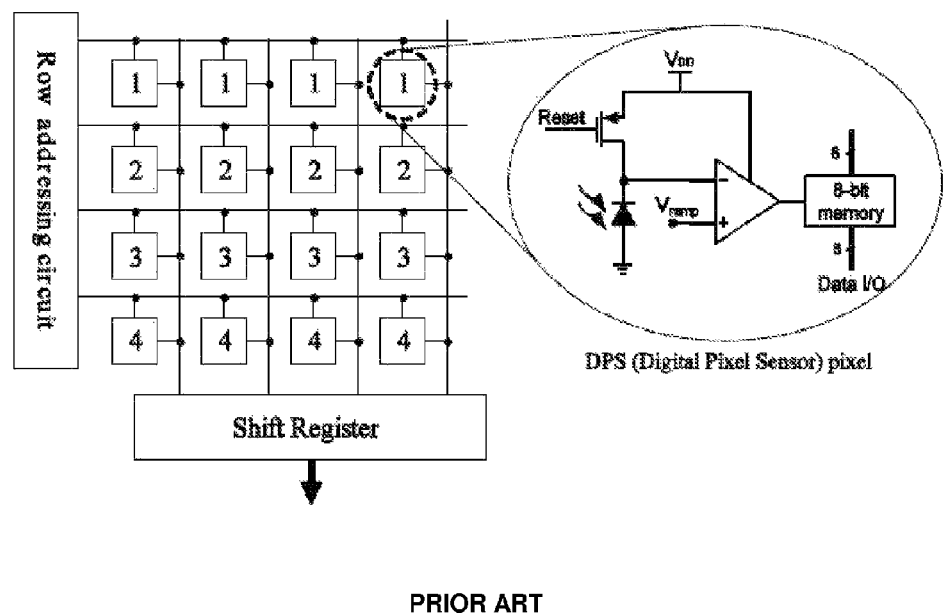
FIG. 4: A schematic representation of a prior art per-pixel digitising architecture.

There are several options for implementation of the readout part of the CIS. In general readout is classified in terms of a pixel-by-pixel Analog-to-Digital-Converter (ADC) as shown in FIG. 2, a per-column ADC as shown in FIG. 3 and per-pixel ADC as shown in FIG. 4. In FIG. 2, each pixel of the CIS, labelled 1 through 16 is individually addressed via the row and column addressing circuits and the voltage on that cell then digitised by the analog-to-digital converter (ADC). In FIG. 3, the four rows of pixels are labelled 1 through 4. Data is extracted column by column using four ADCs. The process involves the row addressing circuit selecting rows 1 through 4 sequentially and the column addressing circuit connecting the analog voltage of each of said columns to their respective ADC. In this way, four operations are required to digitise the four rows of data, into four separate columns of measurements. In FIG. 4, data is digitised locally at each pixel and each row is sequentially latched onto four shift registers, one for each column (although it is drawn as a block of shift registers).

The respective frame rates (FR) for each of these architectures can be modelled assuming known times for each operation. For example tADC is the time necessary for the ADC to complete one conversion, $t_{RO}$ is the time required by the chip I/O to send out the converted digital result, b is the number of digital bits, and n is the number of parallel outputs. In general, there is an inverse linear relationship between frame rate and the number of pixels in the CIS, however some architectures such as the Per-Pixel ADC architecture exhibit a roll-off in frame rate at small pixel counts due to inefficiencies when the number of pixels are small.

Figure 5:
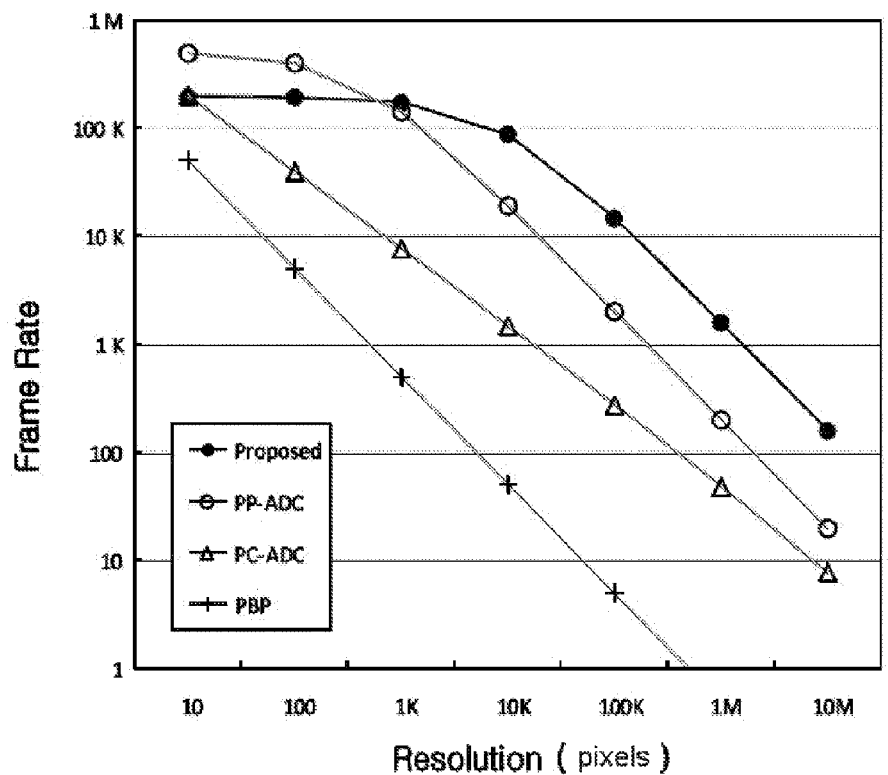
FIG. 5: Comparison of the processing rate (frame rate) of the prior art digitising architectures of FIGS. 2 through 4 with the DPS of the present invention.

It is therefore another broad object of the present invention to improve the data conversion throughput of a CIS. In the DPS pixel disclosed in this invention tADC corresponds to $256/t_{RO}$ for an 8-bit conversion. The remaining parameters are kept the same for comparison. The frame rate of the conversion method disclosed in this invention is between one to three orders of magnitude faster than the traditional architectures of FIGS. 2 through 4 at high pixel count as shown in FIG. 5. At low pixel count, the conversion throughput rolls off significantly but for pixel counts above 1,000 the architecture of the present invention is faster and results in a higher frame rate than current architectures.

It is a general object of the present invention to provide a method, apparatus, system and three-dimensional System on System (SoS) architecture for imaging applications offering improvements in image capture rate, reduction in power consumption and improved distribution of thermal loading. Moreover, the significant aspect of the proposed 3D architecture is the possibility for compression to take place at the sensor level. The advantage offered appears in terms of performance (bandwidth/memory requirements) and reduction in computational complexity. This is applicable, but not limited to, applications in medical imaging, surveillance, and motion detection and guidance systems.

Figure 6A:
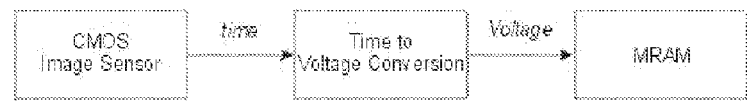
FIG. 6*a*: A schematic representation of an architecture comprising Image sensors, Time-to-Voltage (TTV) con

In a preferred embodiment, the system of the SoS architecture of the present invention consists of three layers: Image sensors, Time-to-Voltage (TTV) convertors and Memristor Memory. Optionally, a conventional memory such as SRAM is able to be used in stead of the memristive memory, but it increases power consumption and consumes additional area. The method involves an Image Sensor integrating the intensity of incident light over a frame window. This is digitised by a Time-to-Voltage (TTV) convertor with the result stored in the MRAM. The architecture is shown schematically in FIG. 6a.

Figure 6B:
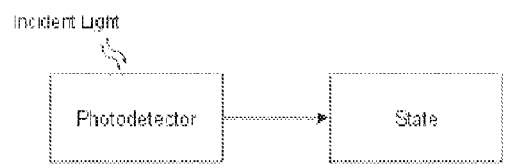
- FIG. 6b: A schematic representation of a generic light to state converter.

The more generic form of the invention disclosed herein is an energy/signal to state converter. In a preferred embodiment a light to state converter is shown in FIG. 6b. Light incident on a photodetector is converted to a state within a memristive element. Said energy/signal may be an electromagnetic signal derived from optical sensors, radio transducers, X-ray detectors, scintillation detectors; may be a phonon signal such as derived from ultrasound transducers; nuclear in nature such as signals derived from CT and MRI scanners, or any other signal. Said state is preferably an analog level which can be representative of a greyscale (for example an 8-bit greyscale) or a simple binary logic level. In a preferred embodiment, the unary DPS architecture is used to write a state to said memristor corresponding to the intensity of incident light.

An additional advantage of the DPS architecture is that the single unary transition is effectively a pulse-width modulated signal that can transfer illumination levels directly to an adjacent layer of a three dimensional stacked processor. This is a very important advantage for a 3-Dimensional stacked layer structure.

Figure 7:
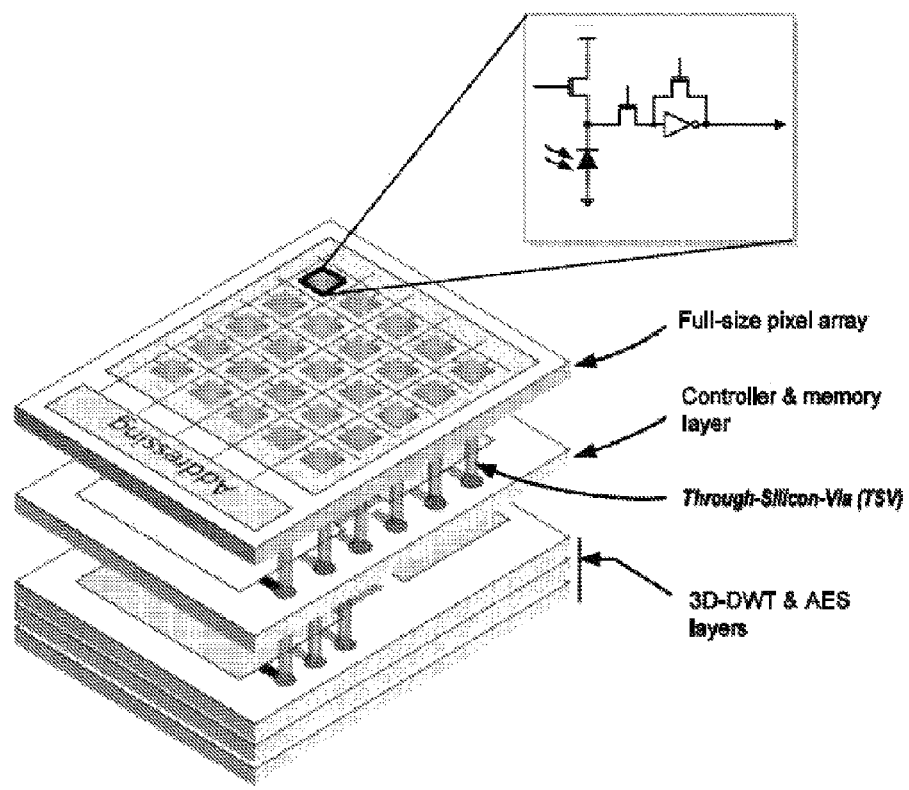
FIG. 7: A schematic representation of a three dimensional stacked layer architecture including through silicon vias.

Conventional CIS usually includes pixel arrays, gain amplifiers, and analog-to-digital converters (ADCs) implemented on the same silicon die. It is therefore an object of the present invention to improve the overall performance of generic CIS by separating the high-speed digital processor layer and the analog layer, optimising each layer separately. The layers are then connected by Through Silicon Vias (TSV). An asynchronous event-driven signal processor can manage communication between the layers. This architecture is shown schematically in FIG. 7.

In a preferred embodiment of the present invention a back-illuminated architecture is adopted to produce high-speed and high-resolution imaging systems. This overcomes the field factor limitation imposed by the front-illuminated architecture. In the back-illuminated architecture, an upper seeing Active Photo Sensor (APS) circuit is mounted above a lower signal processing chip. As well as increasing the fill factor (FF) of the optical imaging layer, this concept also allows the combination of different processing technologies for the different layers, and also gives considerable flexibility in tailoring the colour response of each individual pixel. The back illuminated concept is combined with our novel approach of using a single inverter at the pixel circuit (DPS pixel) in a preferred embodiment.

Separation of optical sensor and processing circuitry into more than one layer offers the opportunity to add additional features to the sensor. It is an object of the present invention to provide image compression on the same structure as the optical sensor. Furthermore an addition object is that the present invention adds data encryption to the sensor stack.

The Discrete Wavelet Transform (DWT) algorithm has been widely used for image processing techniques. Traditionally, the wavelet scheme in image processing is based on treating only still images (2D-DWT). In contrast, the 3D-DWT expands the DWT to three-dimensions for compression of volumetric data, such as that created by CT and MRI scanners. The 3D-DWT has an advantage allowing a series of 2D images to be further compressed in the third dimension by exploiting correlation between the adjacent images in series. The outcome provides for better compression ratios as well as an absence of blocking artefacts. Therefore, such an approach is implemented in a variety of applications including that of image compression and noise reduction demanded by MRI and CT scans.

A 3D image is an extension of 2D images along either the temporal direction (in the case of a movie) or an additional spatial dimension (in the case of a CT or MRI scan). In either case, the third dimension can be treated as if it were a temporal dimension. As such, the 3D-DWT performs a spatial-temporal decomposition along two spatial x, y, and one temporal z direction on the image sequences. The captured image sequences pass through 3D-DWT decomposition and are coded through an embedded block coder. The 3D-DWT repeats the decomposition of one-dimensional DWT.

Conventional 3D-DWT is inefficient since it requires accessing all the image frames at the same time, and thereby significant amount of memory space is needed to perform the DWT process. We introduce the concept of Group of Frames (GoF) here to overcome the drawbacks associated with conventional 3D-DWT. Furthermore, 2D physical implementation of a 3D-DWT algorithm has limitations in terms of compression efficiency due to frame access. Therefore a new architecture based on two layered system is introduced which addresses the frame access issue. The 3D physical implementation using TSV permits accesses to all frames on the same time axis, thus providing better data compression efficiency.

The DPS image sensor of the present invention outputs image data in unary format. A pre-processor is therefore required to convert it to binary in order for DWT compression processing in an adjacent layer. We employ a data format converter that converts data from unary to a binary at the front stage of DWT using a counter. When unary data changes from "0" to "1", the controller writes a count value onto the registers. The dynamic power dissipation is reduced significantly.

The compression architecture disclosed in the present invention provides PSNR for 3D-DWT of 61.0 dB which is higher than the corresponding 2D-DWT PSNR of only 51.2 dB under the same 2:1 compression ratio. The 3D-DWT therefore allows a more aggressive compression to take place, while minimising the impact on PSNR. The comparison between 2D and 3D architectures for MRI and CT images highlighted that 3D implementation provides an improvement in PSNR of about 20% over the corresponding 2D compression.

To address the possible thermal dissipation problem of the central layers that could lead to a rise in temperature, the strategy in our proposed architecture is to change the thermal profile of the central core by interleaving 3-D Discrete Wavelet Transform (3D-DWT) and 3-D Advanced Encryption Standard (3D-AES) into two layers. This approach distributes the switching activity between two layers and as a consequence changes the thermal profile of the core of the stacked structure.

Encryption of image data takes place through a well known block cipher algorithm Advanced Encryption Standard (AES) or similar having a 128-bits input data block with cipher key of length 128-bits, 192-bits or 256-bits. The cipher layer shown in FIG. 7 can encipher and decipher operations using the repeated operation of a Substitute Permute Network (SPN) on 128 bits of data. Each time the SPN is used it is provided with a different Round-Key generated by Key-Expansion function using well known approaches. For example the first round comprises a 128-bit XOR of plaintext with the key to form a new 128-bits state. Each middle round operates on the state by performing a number of known operations. Key expansion generates the keys in advance based on the reception of the initial key.

It is therefore an object of the present invention to provide a method, apparatus, system and architecture for integrated Memristor-MOS ($M^2$) pattern recognition based on an analog memristive matching circuitry that calculates the similarity or dissimilarity between two analog values. The DPS image sensor element of the present invention is compatible with the memristive-MOS matching structure allowing direct comparison between incoming and stored images. The pulse-width encoded information from the pixels is forwarded to a matching circuitry that provides an anti-Gaussian-like comparison between the states of memristors. The output currents from an array of parallel pixels are subsequently summed to identify either similarity or dissimilarity between incoming and stored images.

Figure 8:
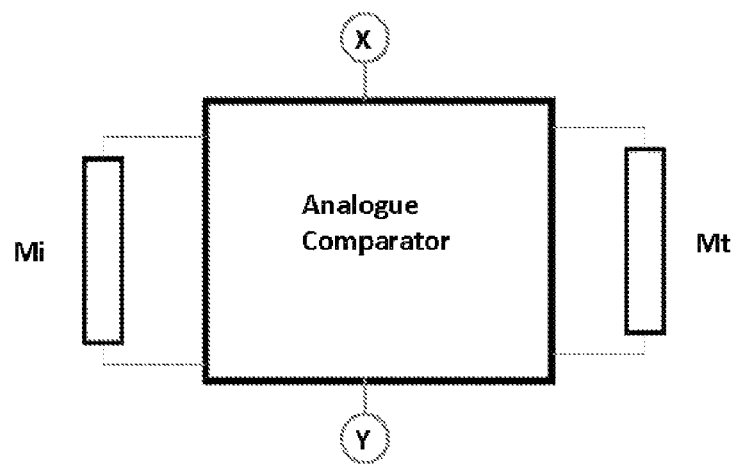
FIG. 8: A schematic representation of an analog memristive matching circuit.

FIG. 8 is a schematic representation of an analog memristive matching circuit. "$M_i$" is the memristor that contains the stored data from the image sensor, "$M_t$" is the memristor that contains stored data from the image template. Node "Y" is one end of the match line (for example Ground or Vss) and node "X" is the match signal that reflects the difference in state between "$M_i$" and "$M_t$". The analog comparator can be considered to be a switch that pulls the voltage of node "X" to node "Y" depending on the strength of the match. In a preferred embodiment, node "Y" is ground potential. A perfect match between "$M_i$" and "$M_t$" would result in node "X" being pulled to ground while a near match would result in node "X" being pulled close to ground.

Figure 9:
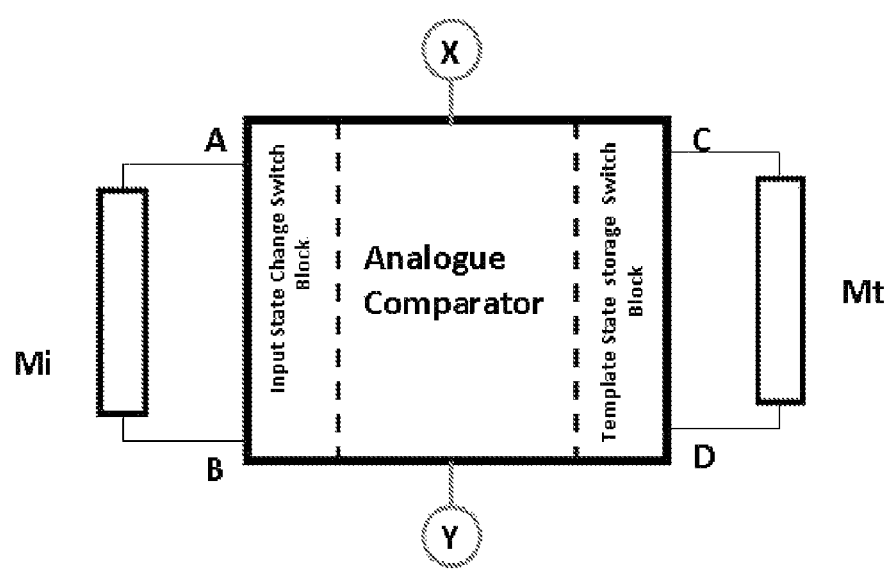
FIG. 9: A more detailed representation of the analog memristive matching circuit of FIG. 7.

FIG. 9 is an expanded view of FIG. 8 which shows how an analog memristive matching circuit also enables writing new image details to the template memristor "$M_t$". The "Input State Change Switch Block" connects incoming signal to Memristor "$M_i$" at node A and stores this new state of Memristor. In a similar way "Template State Change Switch Block" connects incoming signal to Memristor "$M_t$" at node C and stores this new state in the template Memristor. Nodes "B" and "D" can be connected to any combination of signals including Ground (Vss), Positive VDD, or a Pulse signal.

Figure 10:
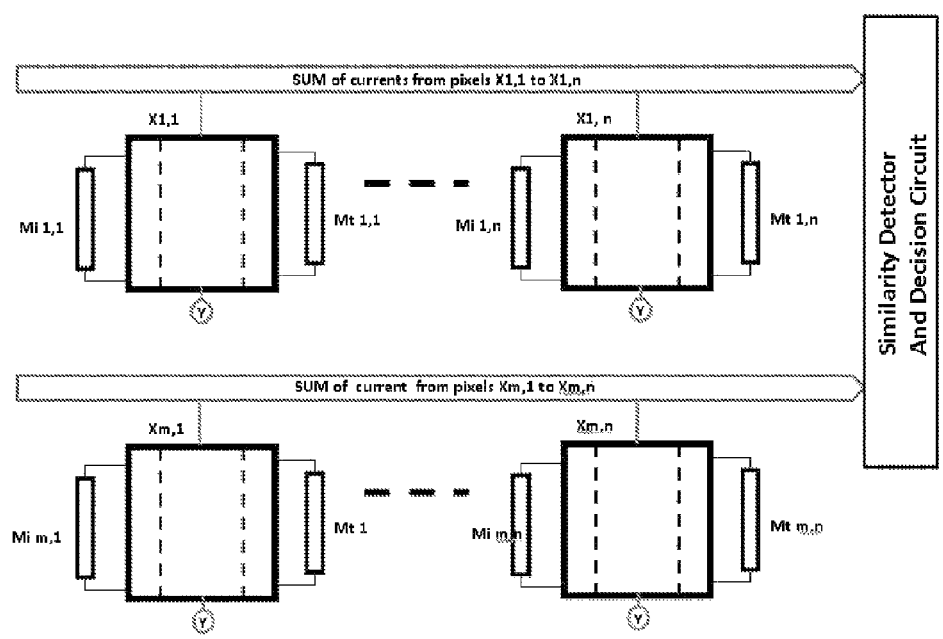
FIG. 10: A schematic representation of a match system corresponding to an array of m×n pixels.

FIG. 10 is a schematic representation of a match system corresponding to an array of m×n pixels. The match signals (corresponding to node "X" of FIG. 8) of each of the "m" row of pixels $X_{1,1}$ to $X_{1,n}$ through $X_{m,1}$ to $X_{m,n}$ are summed together and then combined to determine the degree of match between the image frame and the template.

Figure 11:
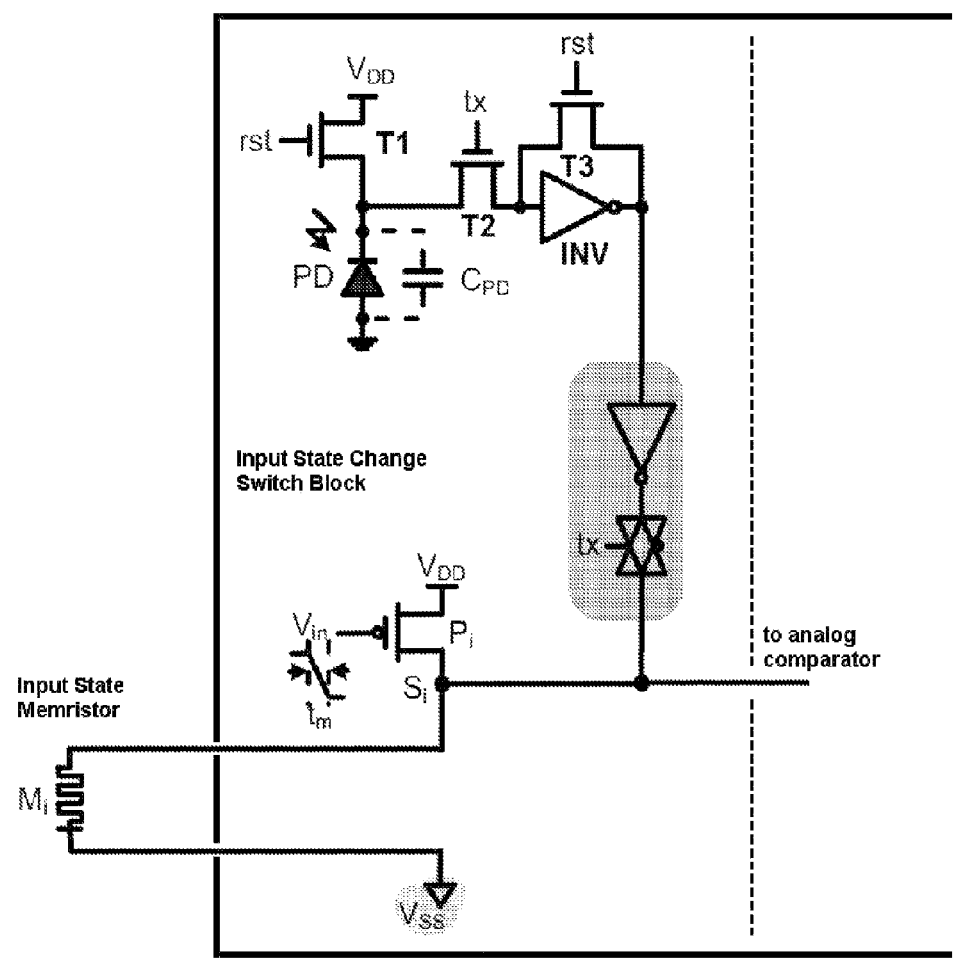
FIG. 11: A schematic representation of the basic Input State Change Switch Block of FIG. 9.

FIG. 11 is a schematic representation of the basic Input State Change Switch Block of FIG. 9. Initially, the incident light is converted to a unary coded time that appears at the output of the inverter. The offset voltage introduced by the inclusion of the inverter "INV" (instead of the more complex conventional comparator) can be removed by connecting the input and output of the first inverter to each other while the pixel is in its reset phase using transistor "$T_3$". The 'tx' signal is enabled and remains high for the integration time, "$T_{int}$". The photodiode reset is a flushed reset to reduce the reset noise and eliminate the possibility of image lag, which is a very serious problem in image recognition systems. Input State Change Switch Block connects the light source to Memristor "$M_i$" and subsequently to the Analog Comparator.

It is a further object of the present invention to provide a method, apparatus and system for image tracking. This invention discloses a form of Memristor MOS pattern recognition which compares analog intensity information captured from an image plane with a plurality of images stored in memory.

Figure 12:
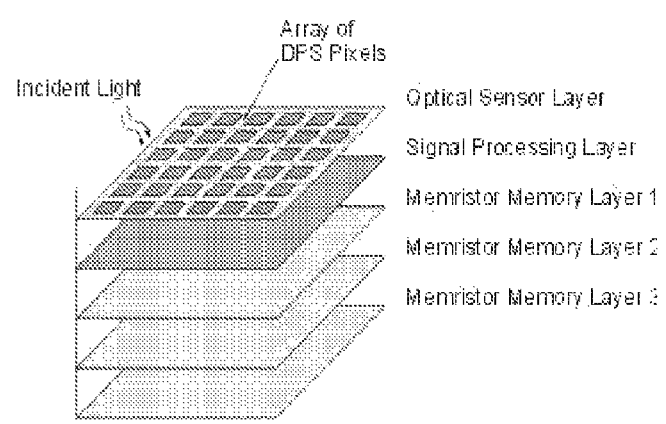
FIG. 12: A schematic representation of a layer structure including an optical sensor layer, a signal processing layer and multiple memristor memory layers according to an embodiment of the present invention.

In a preferred embodiment the present invention implements a layer structure including an optical sensor layer, a signal processing layer and multiple memristor memory layers. The example of FIG. 12 shows three memristor memory layers to simply describe operation, but many more layers are preferable. The optical sensor layer includes photodiodes for image capture. A preferable embodiment includes the DPS pixel architecture disclosed in the present invention.

The following description of the operation of the circuit is a simplified example. A first image (of a beach ball) is captured by said optical sensor layer in a first frame. Said image processing layer stores a pixel accurate copy of the image in a memristor memory layer, layer 2 of FIG. 13. The thin vertical lines are only guide lines to emphasise the location of the beach ball image on the plane. Said image processing layer also stores a copy of said image but shifted by one or more pixels to the left, in another memristor memory layer, layer 1 of FIG. 13. Said image processing layer also stores a copy of said image but shifted by one or more pixels to the right, in another memristor memory layer, layer 3 of FIG. 13. Consider for simplicity the case where the positional shift between memristor layers is only one pixel.

When a second image frame is captured it can be quickly compared to the plurality of positional translated copies of said first image in their respective memristor memory layers. If said second image contains an image similar to said first image, but translated by one pixel to the left, then a match would be detected by memristor memory Layer 1. Knowledge of the translational offset of the matched layer indicates the direction of motion across the image plane. In this way a system can be deployed to capture an arbitrary image and perform a tracking function within the single clock cycle match time of a MRAM pattern recognition engine.

This description only describes linear translational motion across an image plane, but it the invention is equally suited to rotational translations and combinations thereof.

Additionally, said second image would then be stored in each of the memristor layers, with the respective translations as defined above. This recursive approach of first matching an image with a memristor memory layer and secondly rewriting (or updating) each of said memristor memory layers to the most recently captured image allows for a continuous image tracking system.

In a further preferred embodiment, the present invention provides a method, apparatus and system for tracking elements of an image and transmitting only those elements of the image that have moved, thereby reducing the bandwidth requirements of the associated communication system. This is effectively a combination of image compression and tracking functions.

Figure 13:
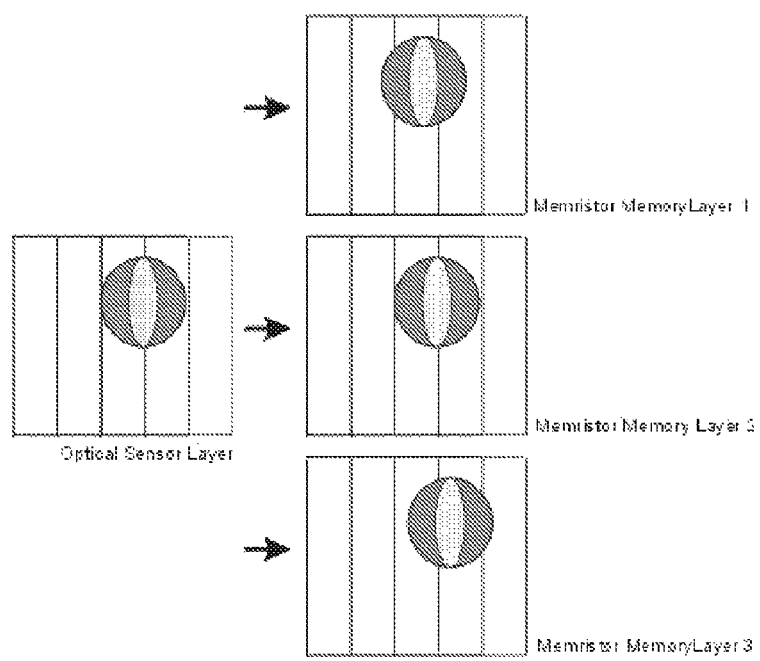
FIG. 13: A schematic representation of an image being mapped onto multiple memristive memory planes with positional translation.

Taking the example of the image of a beach ball in FIG. 13 one step further, as the ball moves across the background image in subsequent frames, an edge detection algorithm may be used to locate the edge of the ball by looking for the areas of matching within a given memristor memory layer. In a preferred embodiment, edge detection for rotationally invariant solid objects would be implemented by determining which elements of an image were moving in a certain direction. For example a given object would match one of the plurality of translated match layers. The object itself would be able to be extracted from the background of the image and the outline (edge detection) would be determined by the match pattern.

This approach would provide a significant improvement in image compression. Only small areas of each image, corresponding to the changes on several memristor memory layers need be stored along with their relative positional change from the previous frame. In some cases this provides an extremely high data compression ratio.

Furthermore multiple objects within the field of view may be tracked simultaneously by observing the different memristor memory layers that each subsequent frame maps to for a given object.

Figure 14:
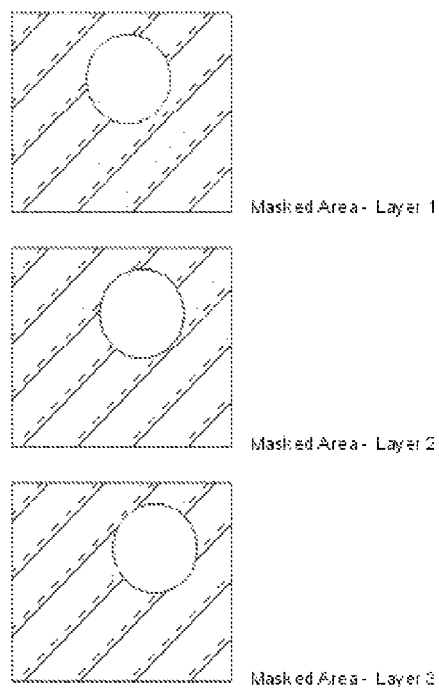
FIG. 14: A masked or ternary masked version of the memory planes of FIG. 12.

The example described by way of FIG. 13 only describes simple perfect matching of images across multiple frames. Grey scale tolerance may be applied to the matching algorithm so that there is more tolerance for changes in overall image intensity (due to lighting changes from frame to frame). Ternary match masking may also be applied to the memristor memory layers in order to isolate objects of interest within the field of view. The mask pattern may first be determined by the edge detection pattern recognition of a first image as disclosed in the present invention. This is shown schematically in FIG. 14 where the memristor memory layers of FIG. 11 are shown with a shaded ternary mask. Only the non-shaded unmasked area need be powered for image comparison, further reducing power.

These embodiments will find application in areas of image recognition, tracking and targeting where positional information is required to be extracted from an image. In a targeting system, a positional change of the image from one frame to the next could indicate that the system has strayed from the desired course. In this case a closed loop course adjustment method and system may be implemented in order to ensure that the image remains centred and the device is always adjusted according to maintain the best image match for the memristor memory layer that corresponds to the initial or desired targeted image.

It will be readily appreciated by those skilled in the art that the various embodiments presented in this disclosure can be combined as desired and are in fact intended to be combined to provide additional functionality in preferred embodiments. The embodiments presented herein are not intended to present a limitation on the scope of the present invention, rather they serve to highlight certain aspects of the much broader present invention.

What is claimed is:

1. A high throughput CMOS Image Sensor including:
a plurality of digital image sensors arranged in a two dimensional array;
each digital image sensor including:
a photodiode;
an inverter;
a first transistor connecting a cathode of the photodiode to a positive supply rail;
a second transistor connecting the cathode of the photodiode to an input of the inverter;
a third transistor connected to the input and an output of the inverter configured to cancel offset voltage when the second transistor is off;
wherein said first transistor provides a reset of said photodiode, said second transistor provides a path for discharging the input of said inverter through said photodiode and the output of the inverter is unary encoded;
a plurality of unary to binary converters for sequentially converting output of a plurality or rows of the digital image sensors to binary numbers;
a controller for synchronising readout from the plurality of rows of the digital image sensors.

2. The high throughput CMOS Image Sensor of claim 1 further including embedded memory configured to store data from digital pixel sensors.

3. The high throughput CMOS Image Sensor of claim 2 wherein the embedded memory comprises memristors further including: memory configured to store a non-volatile pixel template; and a memory comparator configured to compare states of the non-volatile pixel template and the memristors such that the result of a comparison is a determination of the degree of match.

* * * * *